(12) United States Patent
Zuccollo et al.

(10) Patent No.: US 12,191,768 B2
(45) Date of Patent: Jan. 7, 2025

(54) DETECTING FAILURE FOR MULTI-RAIL SUPPLY PROTECTION

(71) Applicant: Infineon Technologies AG, Neubiberg (DE)

(72) Inventors: Andrea Zuccollo, Villa del Conte (IT); Danilo Cellucci, Velletri (IT); Cristina Chiereghin, Camposampiero (IT)

(73) Assignee: Infineon Technologies AG, Neubiberg (DE)

( * ) Notice: Subject to any disclaimer, the term of this patent is extended or adjusted under 35 U.S.C. 154(b) by 425 days.

(21) Appl. No.: 17/662,250

(22) Filed: May 6, 2022

(65) Prior Publication Data
US 2023/0361676 A1 Nov. 9, 2023

(51) Int. Cl.
*H02M 3/158* (2006.01)
*H02M 1/32* (2007.01)
*H03K 17/0814* (2006.01)

(52) U.S. Cl.
CPC ............ *H02M 3/158* (2013.01); *H02M 1/32* (2013.01); *H03K 17/08142* (2013.01); *H03K 2217/0063* (2013.01); *H03K 2217/0072* (2013.01)

(58) Field of Classification Search
CPC ..... G05F 1/00; G05F 1/10; G05F 1/12; G05F 1/46; G05F 1/455; G05F 1/45; G05F 1/445; G05F 1/66; G05F 1/40; G05F 1/42; G05F 1/44; G05F 1/462; G05F 1/52; G05F 1/56; G05F 3/10; G05F 3/16; G05F 3/18; G05F 3/185; G05F 3/20; G05F 3/26; G05F 3/30; G05F 3/205; G05F 3/22; G05F 3/24; G05F 3/222; G05F 3/242; G05F 3/225; G05F 3/227; G05F 3/245; G05F 3/247; G05F 3/262; G05F 3/265; G05F 3/267; G05F 1/575; H02M 5/2573; H02M 1/081; H02M 5/293; H02M 7/12; H02M 3/10; H02M 3/125; H02M 3/13; H02M 3/135; H02M 3/145; H02M 3/15; H02M 3/155; H02M 3/156; H02M 3/157; H02M 3/158; H02M 1/346; H02M 3/1588; H02M 2003/1566;
(Continued)

(56) References Cited

U.S. PATENT DOCUMENTS

6,275,958 B1 * 8/2001 Carpenter ............ H02M 3/158
714/48
9,438,100 B2 * 9/2016 Collins ................ H02H 7/1252
(Continued)

*Primary Examiner* — Jeffrey A Gblende
(74) *Attorney, Agent, or Firm* — Shumaker & Sieffert, P.A.

(57) ABSTRACT

A circuit for detecting failure of a device includes an on-phase detector, an off-phase detector, and protection switch circuitry. The on-phase detector is configured to determine whether a first failure has occurred at the device based on a rate of change of a current at a high-side switching element. The off-phase detector is configured to determine whether a second failure has occurred at the device based on both a current at a low-side switching element and a voltage at a switch node that is electrically coupled to the high-side switching element and the low-side switch. The protection switch circuitry is configured to electrically disconnect the high-side switching element from a supply circuit in response to the on-phase detector determining that the first failure has occurred at the device or in response to the off-phase detector determining that the second failure has occurred at the device.

20 Claims, 9 Drawing Sheets

(58) Field of Classification Search
CPC ............. H02M 3/1582; H02M 3/1584; H02M 2003/1557; H02M 1/0032; H02M 1/4225; H02M 7/217; H02M 1/0025; H02M 1/0045; H02M 1/0009; H02M 1/08; H02M 1/088; H02M 1/0048; H05B 39/048; B23K 11/24; H04B 2215/069; H03K 17/06; H03K 17/081; H03K 17/0814; H03K 17/08142; H03K 2217/0063; H03K 2217/0072

See application file for complete search history.

(56) References Cited

U.S. PATENT DOCUMENTS

| | | | | |
|---|---|---|---|---|
| 2015/0311780 A1* | 10/2015 | Tomas | ................. | H02H 7/1225 |
| | | | | 363/50 |
| 2018/0375320 A1* | 12/2018 | Ho | ........................... | H02H 3/20 |
| 2022/0294208 A1* | 9/2022 | Xu | ..................... | H03K 17/0822 |

* cited by examiner

DETECTING FAILURE FOR MULTI-RAIL SUPPLY PROTECTION

TECHNICAL FIELD

This disclosure relates to techniques for detecting a failure in hardware components.

BACKGROUND

Monitoring systems can be used to detect a failure in a hardware component of a device. For example, a monitoring device may detect when a voltage output by a voltage regulator exceeds a safety voltage threshold. In response to the voltage exceeding the safety voltage threshold, the monitoring device may be configured to disable the voltage supply to help to prevent failures in the device and to help to ensure safety to users of the device.

SUMMARY

In general, this disclosure is directed to techniques for ensuring safety in the operation of circuits (e.g., regulators) of a device. For example, a circuit may include a high-voltage pre-regulator (e.g., a Buck converter) that receives a battery voltage and outputs a first voltage. In this example, one or more low-voltage post-regulators (e.g., a Buck converter, a Boost converter, or a low-dropout regulator) may generate a second voltage from the first voltage output by the high-voltage pre-regulator.

In accordance with the techniques of the disclosure, an on-phase detector and an off-phase detector may be configured to detect a failure (e.g., a short circuit) of a device within one switching cycle. In this way, a failure of the device (e.g., the high-voltage pre-regulator) may be potentially mitigated within one switching cycle, which may help to protect both the high-voltage pre-regulator and circuits that are supplied by the high-voltage pre-regulator (e.g., the low-voltage post-regulators). Moreover, in some examples, systems configured to detect the failure within one switching may permit use of a single protection mechanism, which may reduce a number of components used for protection compared to systems that rely on protection circuits for each regulator.

In one example, a circuit for detecting failure of a device includes an on-phase detector, an off-phase detector, and protection switch circuitry. The on-phase detector is configured to determine whether a first failure has occurred at the device based on a rate of change of a current at a high-side switching element of a power converter. The off-phase detector is configured to determine whether a second failure has occurred at the device based on both a current at a low-side switching element of the power converter and a voltage at a switch node that is electrically coupled to the high-side switching element and the low-side switch. The protection switch circuitry is configured to electrically disconnect the high-side switching element from a supply circuit in response to the on-phase detector determining that the first failure has occurred at the device or in response to the off-phase detector determining that the second failure has occurred at the device.

In another examples, a method for detecting failure of a device includes determining whether a first failure has occurred at the device based on a rate of change of a current at a high-side switching element of a power converter and determining whether a second failure has occurred at the device based on both a current at a low-side switching element of the power converter and a voltage at a switch node that is electrically coupled to the high-side switching element and the low-side switch. The method further includes electrically disconnecting the high-side switching element from a supply circuit in response determining that the first failure has occurred at the device or in response to determining that the second failure has occurred at the device.

In one example, a system includes a power converter and a circuit for detecting failure. The power converter is configured to output an output voltage, the power converter comprising a high-side switching element and a low-side switching element. A switch node is electrically coupled to the high-side switching element and the low-side switch. The circuit for detecting failure of a device includes an on-phase detector configured to determine whether a first failure has occurred at a device based on a rate of change of a current at the high-side switching element and an off-phase detector configured to determine whether a second failure has occurred at the device based on both a current at the low-side switching element and a voltage at the switch node. The circuit for detecting failure further includes protection switch circuitry configured to electrically disconnect the high-side switching element from a supply circuit in response to the on-phase detector determining that the first failure has occurred at the device or in response to the off-phase detector determining that the second failure has occurred at the device.

Details of these and other examples are set forth in the accompanying drawings and the description below. Other features, objects, and advantages will be apparent from the description and drawings, and from the claims.

DETAILED DESCRIPTION

This disclosure is directed to techniques for detecting failure of a device, such as a power management circuit or another type of circuit within a larger system. The techniques for detecting failure of a device as described herein may address safety techniques, such as, for example, one or more safety processes addressed in the ISO 26262. In some examples, techniques for detecting failure of a device as described herein may be applied to, for example, automotive systems or settings. Some safety mechanisms perform a built-in self-test (BIST) at least once per driving cycle as per the ISO 26262.

In power management integrated circuits (PMICs) with multi rail step down regulators with an integrated power stage, failures may include a short between a source and a drain of the various high-side switching elements. The fault at the high-side switching element may propagate the step-down supply voltage to the output voltage that might overcome a maximum voltage rating, potentially causing damage to the device itself and to the devices supplied by the step-down regulator. The protection of each regulator can become expensive from number of discrete components point of view or from PMIC area and cost point of view.

In accordance with techniques described herein, an on-phase detector and an off-phase detector may be configured to detect a failure of a device within one switching cycle. For example, a system may be configured to disconnect, within one switching cycle, the supply voltage with one single protection. A first detection mechanism may be based on a different working mode of a current sense circuit present in a Buck converter. A second detection mechanism may be based on a different working mode of two comparators, which may be already present in the Buck converter. Current sense circuitry and a fast overvoltage circuit may be use to provide protection for a failure (e.g., a short circuit) during a tri-state condition. The use of the first and second detection mechanisms may be help to ensure that the output voltage of the regulators is within a maximum voltage rating, which may help to prevent any damage on internal structures and on bonding. The techniques for disconnecting, within one switching cycle the supply voltage may be suitable in a system that guarantees a high Automotive Safety Integrity Level (ASIL) level in an ISO 26262 context.

Figure 1:
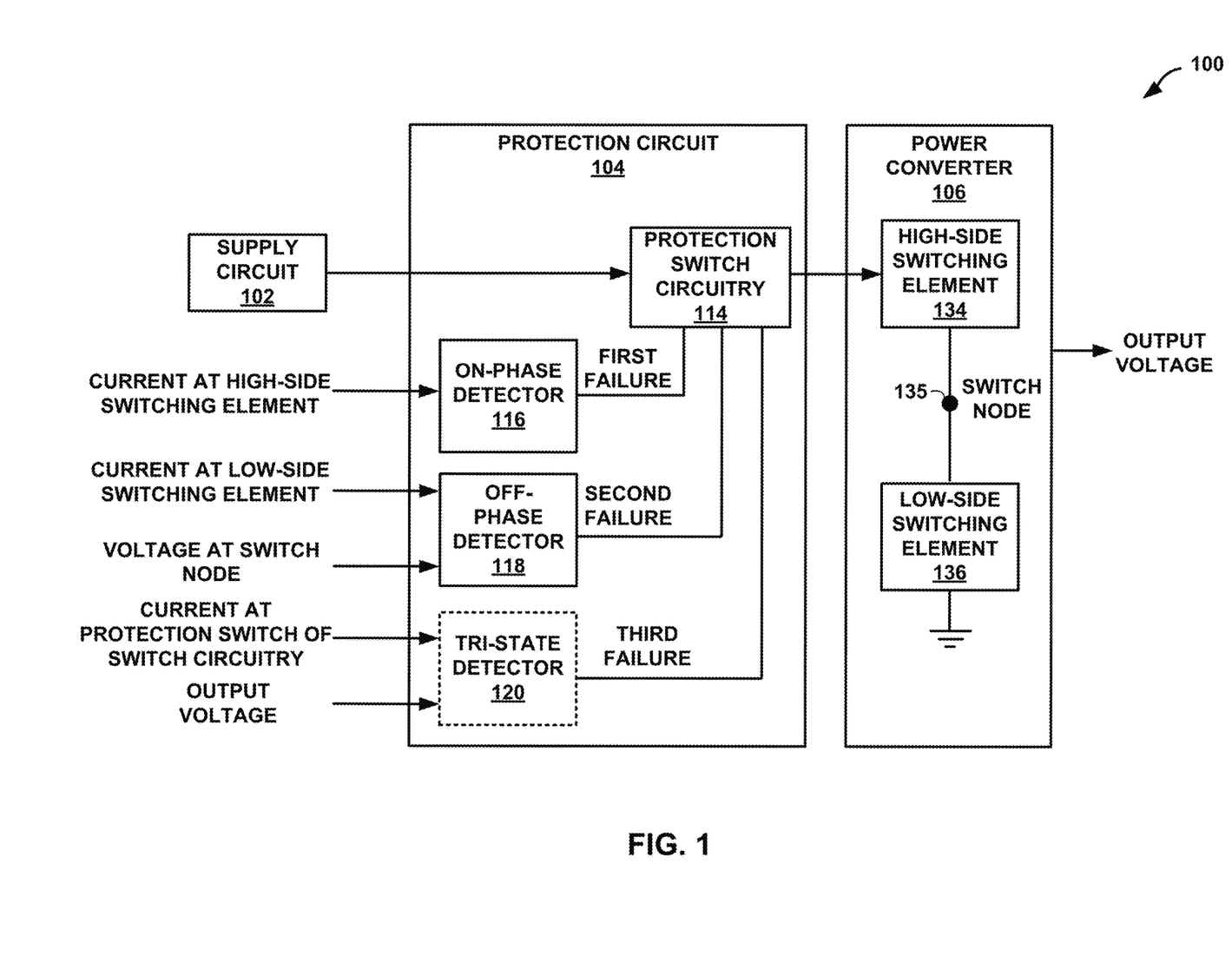
FIG. 1 is a block diagram illustrating an example system for detecting failure of a device, in accordance with one or more techniques of this disclosure.

FIG. 1 is a block diagram illustrating an example system for detecting failure of a device, in accordance with one or more techniques of this disclosure. As illustrated in the example of FIG. 1, device 100 may include supply circuit 102, protection circuit 104, and power converter 106.

Supply circuit 102 may output a supply electrical power to components of system 100. For example, supply circuit 102 may represent a battery configured to output a battery voltage. In this example, power converter 106 may convert the battery voltage to an output voltage that is different (e.g., less than or greater than) from the battery voltage.

Power converter 106 may be configured to regulate an output voltage. Power converter 106 may comprise a switch-mode power converter or another type of power converter. Examples of switch-mode power converters may include, but are not limited to, flyback, buck-boost, buck, Ćuk, or another switch-mode power converter. In some examples, power converter 106 may receive a voltage and output a voltage that is different from the received voltage. For instance, power converter 106 may receive a battery voltage from supply circuit 102 and output, to voltage converter 106, a first voltage that is less than the battery voltage. More specifically, in some examples, power converter 106 may include a DC/DC converter, such as a Buck converter that bucks (e.g., reduces) a battery voltage received from supply circuit 102. Power converter 106 may boost the battery voltage received from supply circuit 102.

As shown, power converter 106 may include, a high-side switching element 134 and a low-side switching element 136. A switch node 135 may be electrically coupled to high-side switching element 134 and low-side switching element 136. Examples of switching elements may include, but are not limited to, a silicon-controlled rectifier (SCR), a Field Effect Transistor (FET), and a bipolar junction transistor (BJT). Examples of FETs may include, but are not limited to, a junction field-effect transistor (JFET), a metal-oxide-semiconductor FET (MOSFET), a dual-gate MOSFET, an insulated-gate bipolar transistor (IGBT), any other type of FET, or any combination of the same. Examples of MOSFETS may include, but are not limited to, a depletion mode p-channel MOSFET (PMOS), an enhancement mode PMOS, depletion mode n-channel MOSFET (NMOS), an enhancement mode NMOS, a double-diffused MOSFET (DMOS), any other type of MOSFET, or any combination of the same. Examples of BJTs may include, but are not limited to, PNP, NPN, heterojunction, or any other type of BJT, or any combination of the same. Switching elements may be voltage-controlled and/or current-controlled. Examples of current-controlled switching elements may include, but are not limited to, gallium nitride (GaN) MOSFETs, BJTs, or other current-controlled elements.

Protection circuit 104 may be configured to provide protection to device 100. Protection circuit 104 may be configured to detect a failure (e.g., a short circuit or an overvoltage) in device 100 and to electrically disconnect high-side switching element 134 of power converter 106 from supply circuit 102 in response to detecting a failure. As shown, protection circuit 104 may include protection switch circuitry 114, on-phase detector 116, and off-phase detector 118, and optionally include tri-state detector 120.

On-phase detector 116 may be configured to determine whether a first failure has occurred at device 100 based on a rate of change of a current at high-side switching element 134. For example, on-phase detector 116 may be configured to determine that the first failure has occurred at device 100 when the rate of change of the current at high-side switching element 134 is greater than a rate of change threshold value. On-phase detector 116 may receive an indication of current at high-side switching element 134 and generate the rate of change of the current at high-side switching element 134. In some examples, on-phase detector 116 may receive the rate of change of the current at high-side switching element 134.

Off-phase detector 118 may be configured to determine whether a second failure has occurred at device 100 based on both a current at low-side switching element 136 and a voltage at switch node 135. For example, off-phase detector 118 may be configured to determine that the second failure has occurred at device 100 based on receiving an indication that the current at low-side switching element 136 is negative and an indication that the voltage at switch node 135 exceeds a voltage threshold value.

When included in protection circuit 104, tri-state detector 120 may be configured to determine whether a third failure has occurred at device 100 based on both a current at high-side switching element 134 and an output voltage output by power converter 106. For example, tri-state detector 120 may be configured to determine that the third failure has occurred at device 100 when the current at high-side switching element 134 is greater than an input current threshold value and to determine that the third failure has occurred at the device when the output voltage output by power converter 106 exceeds an input voltage threshold value.

Protection switch circuitry 114 may be configured to electrically disconnect high-side switching element 134 from supply circuit 102 in response to on-phase detector 116 determining that the first failure has occurred at the device or in response to off-phase detector 118 determining that the second failure has occurred at the device. Protection switch circuitry 114 may optionally electrically disconnect high-side switching element 134 from supply circuit 102 in response to tri-state detector 120 determining that a third failure has occurred at the device. Electrically disconnect high-side switching element 134 from supply circuit 102 using on-phase detector 116 and off-phase detector 118 may permit protection switch circuitry 114 to disconnect supply circuit 102 from high-side switching element 134 within one switching cycle. In this way, protection circuit 104 may help to keep the output voltage of power converter 106 within a maximum voltage rating, which may help to prevent any damage on internal structures and on bonding of device 100. The techniques for disconnecting, within one switching cycle, supply circuit 102 from high-side switching element 134 may help to provide a high ASIL level in an ISO 26262 context.

Figure 2:
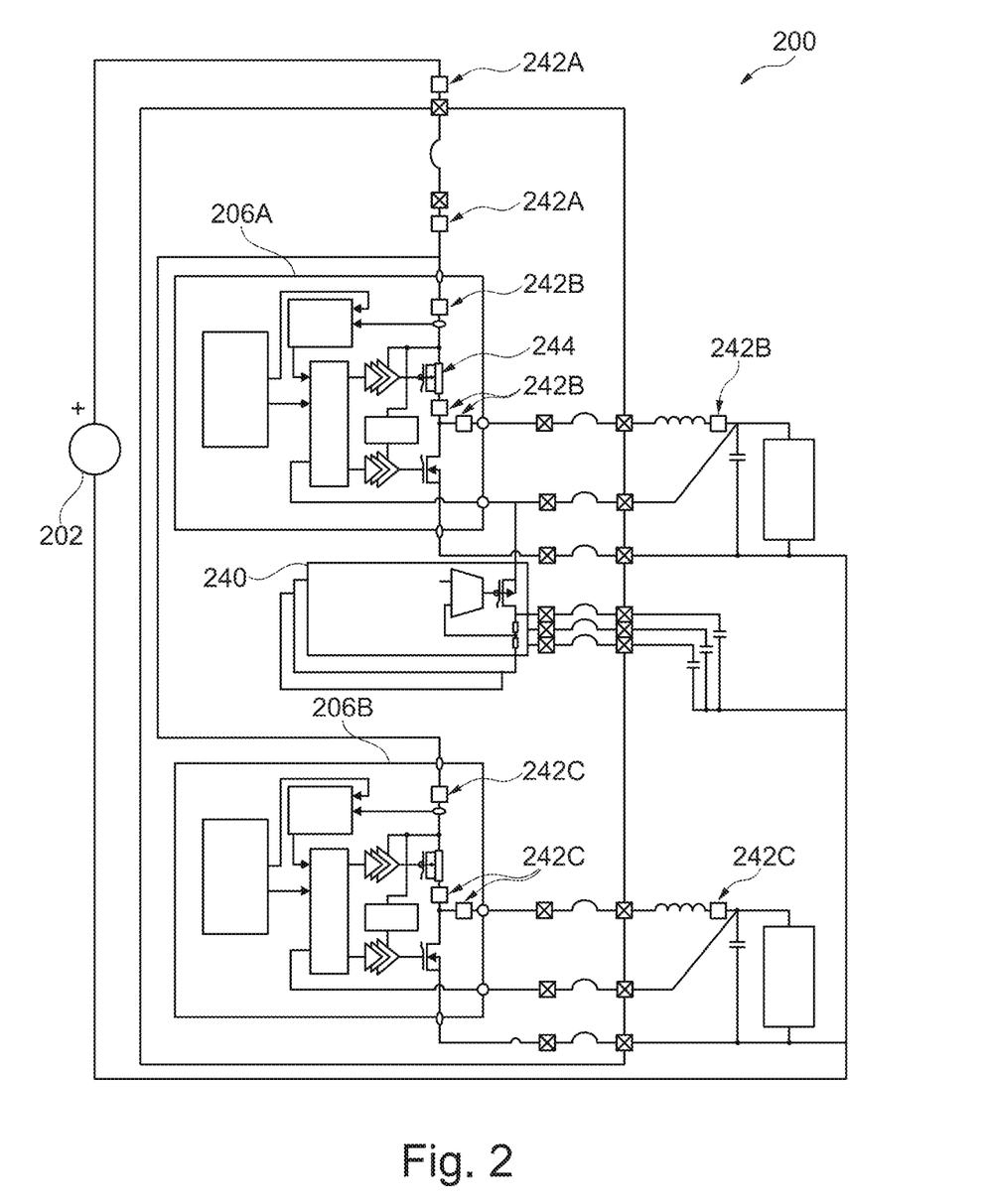
FIG. 2 is a conceptual diagram illustrating an example device and potential failures of the device, in accordance with one or more techniques of this disclosure.

FIG. 2 is a conceptual diagram illustrating an example device 200 and potential failures of device 200, in accordance with one or more techniques of this disclosure. In automotive supply devices developed for safety applications, particular care is considered to protect devices against dangerous overvoltage, especially for PMICs, where one or more high voltage pre-regulators 206 may be used to bias one or more low voltage post-regulators 240 or directly some applications.

One example technique to protect high voltage pre-regulators 206A, 206B (collectively, high voltage pre-regulators 203) and/or low voltage post-regulators 240 is to place a switch capable to open the path towards the battery 202 in order to prevent the propagation of high voltages to the loads. The path can be opened at various points 242A-242C, by opening the path at the input of the pre-regulator one redundancy switch can protect all the post-regulators and loads. For example, points 242A, 242B may represent opening points for high voltage pre-regulator 206A in response to a drain source short 244. A very fast reaction time of points 242A-242C may be necessary to help to prevent high voltage propagation from a short.

Circuits and techniques described herein may use an on-phase detector and an off-phase detector to add a protection in the battery line path in order to protect from destructive overvoltages that may occur on all the low voltage post-regulators 240 connected to battery 202. Each regulator of low voltage post-regulators 240 has internally a detection mechanism of the failure that activates the protection.

In the example of FIG. 2, a block level diagram shows an example for two step-down converters (Buck 1 and Buck 2), and shows example break points 242 for the power paths. As can be observed in FIG. 2, depending on the break-point position, the protection may act for both high voltage pre-regulators 206A, 206B or just for one at time. The break-point can be internal or external. A desirable solution is to break the battery path where all the regulators are protected, then the break point can be internal or external depending on flexibility or area consumption requirements. This consideration can be easily generalized for the single or multiple buck regulator case.

The break-point can be implemented, in various examples, with any kind of electrically controllable switch like a power DMOS (n-type or p-type). In the example of FIG. 2, an NLDMOS has been used and will be called as "protection switch" or "cut-off switch" put at a battery input of the PMIC. However, the protection switch may include other types of switching elements. The detection mechanism described herein may be very fast (e.g., less than a switching cycle) to help to prevent a high risk to dramatically increase the current through the inductance reaching saturation. The consequences of the current through the inductance reaching saturation could be one or more of an output voltage being over the maximum rating of the loads and/or of other post-regulators and users; or bonding damage (e.g., electro-migration). In the case of overvoltage, internal structures or external loads might be damaged (e.g., avalanche break-down, snapback, exceed of safe operating area). Bonding damage may be difficult to predict and an additional short might be created.

Figure 3:
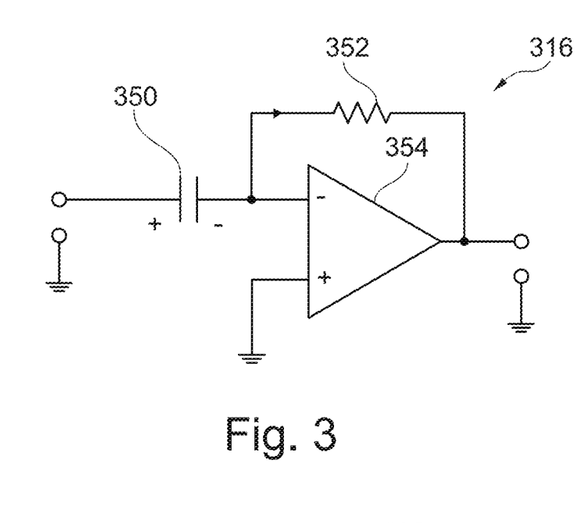
FIG. 3 is a conceptual diagram illustrating an example on-phase detector, in accordance with one or more techniques of this disclosure.

FIG. 3 is a conceptual diagram illustrating an example on-phase detector 316, in accordance with one or more techniques of this disclosure. As shown, on-phase detector 316 may represent a differentiator circuit. For example, on-phase detector 316 may include a capacitor 350, a resistive element 352, and an operation amplifier 354. Capacitor 350 includes a first node configured to receive an indication of the current ($I_{in}$) at a high-side switching element and a second node. Resistive element 352 includes a first node coupled to the second node of capacitor 350 and a second node. Operational amplifier 354 includes a first input (−) coupled to the second node of capacitor 350 and the first node of resistive element 352, a second input (+) coupled to a reference voltage (e.g., ground), and an output (e.g., −$V_{out}$) electrically coupled to the second node of resistive element 352. The differentiator circuit illustrated in FIG. 3 may be used to detect failure during the HS_on phase and/or the HS_off phase.

Figure 4:
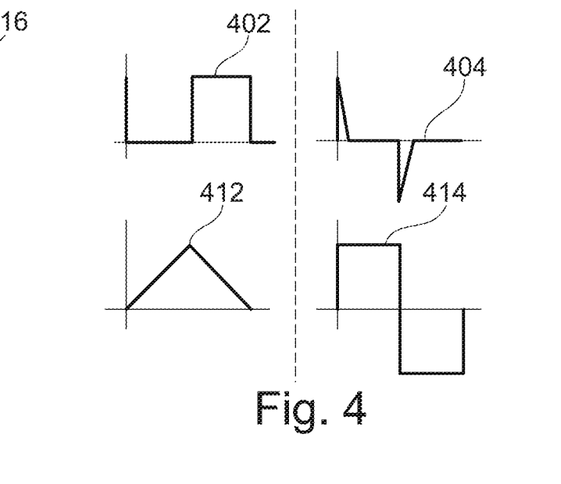
FIG. 4 is a graph illustrating a performance of the on-phase detector of FIG. 3, in accordance with one or more techniques of this disclosure.

FIG. 4 is a graph illustrating a performance of on-phase detector 316 of FIG. 3, in accordance with one or more techniques of this disclosure. For an input signal 402 of a square wave, on-phase detector 316 outputs spikes 404. For an input signal 412 of a triangle wave, on-phase detector 316 outputs a rectangular signal 414.

During the ON phase where the overcurrent current sense is supposed to operate with a clean behavior (e.g., out of the masking time, and far from movement of a SW node), the output sensed current should be always increasing due to inductor as shown for input signal 402. Differentiator amplifier 354 may help to provide a constant and flat voltage at an output in case of a ramp at the input as represented by rectangular signal 414. In case of a short at the high-side of the Buck converter, the overcurrent current sense is supposed to be not able to operate, and will output a flat and constant current as shown in input signal 412. Differentiator amplifier 35 may then provide a spikes 404 and a LOW voltage at the output in case of a flat and constant current at the input. Sensing the output of differentiator amplifier 354 by a voltage comparator during the phase of interest may help to provide a failure detection signal that can be used to trigger the shut-down of the battery protection switch.

Figure 5:
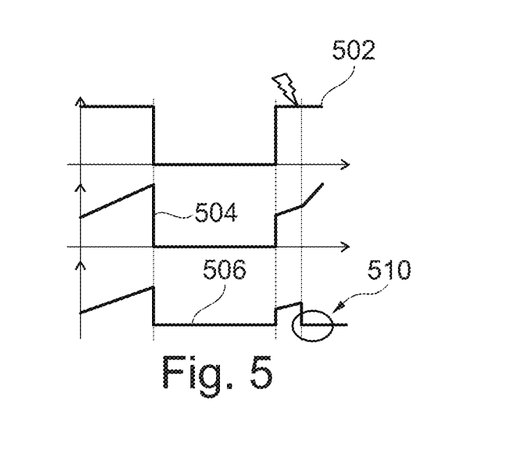
FIG. 5 is a conceptual diagram illustrating an example on-phase detection, in accordance with one or more techniques of this disclosure.

FIG. 5 is a conceptual diagram illustrating an example on-phase detection, in accordance with one or more techniques of this disclosure. In the example of FIG. 5, the abscissa axis represents time and the ordinate axis represents gate voltage 502 at high-side switching element 134, a current 504 at high-side switching element 134, and a sensed current 506 at high-side switching element 134. At time 510, on-phase detector 116 may determine that a first failure has occurred at device 100 based on a rate of change of sensed current 506 being less than a rate of change threshold value.

Figure 6:
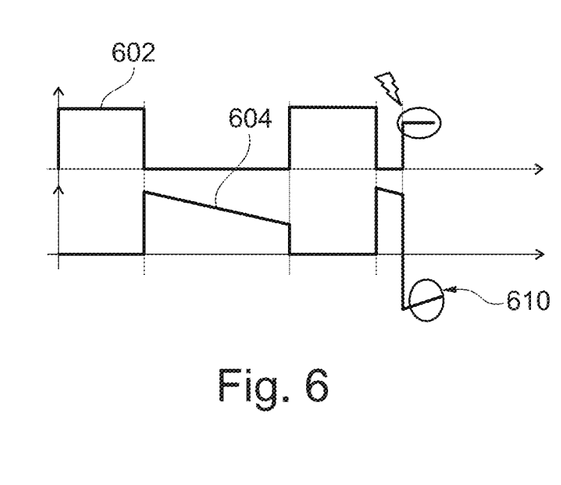
FIG. 6 is a graph illustrating a performance of the off-phase detection, in accordance with one or more techniques of this disclosure.

FIG. 6 is a graph illustrating a performance of the off-phase detection, in accordance with one or more techniques of this disclosure. In the example of FIG. 6, the abscissa axis represents time and the ordinate axis represents voltage at a switch node 135 and a current 604 at low-side switching element 136. At time 610, off-phase detector 118 may determine that a second failure has occurred at device 100 based on both a current 640 at low-side switching element 136 being less than a threshold (e.g., negative) and a voltage at a switch node 135 being greater than a voltage threshold value.

Figure 7:
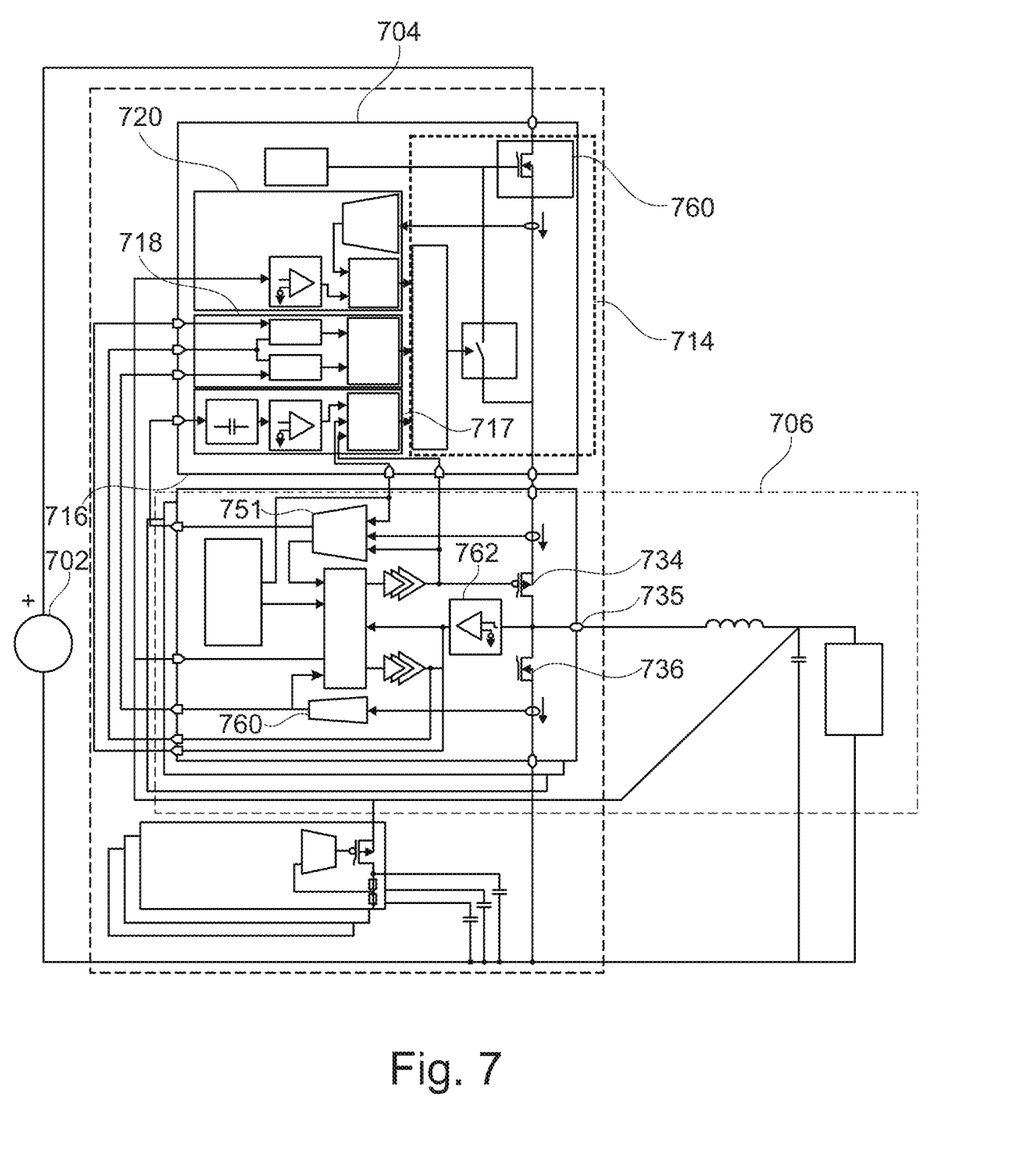
FIG. 7 is a conceptual diagram illustrating an example circuit for detecting failure of a device, in accordance with one or more techniques of this disclosure.

FIG. 7 is a conceptual diagram illustrating an example circuit 704 for detecting failure of a device 700, in accordance with one or more techniques of this disclosure. Circuit 704 may be configured to react by switching OFF protection switch 760 within one switching cycle using detection mechanisms according to the step-down regulator SW status: ON phase or OFF phase and optionally in the tri-state phase. Protection switch 760 or cut OFF switch ("Co-switch") could be a NLDMOS with a driver operated using a charge pump. Protection switch 760 may be internal or external to circuit 704. The differentiator implemented by on-phase detector 716 can be done by using the architecture suggested in FIG. 3 or using a differential pair degenerated with a capacitor. The output voltage comparator of tri-state detector 720 can be done by using a Zener diode and resistor. The current sense of the current at protection switch 760 could be done with a VIA current mirror.

To detect the high-side failures, circuit 704 may use on-phase detector 716 during the high-side on phase and the off-phase detector 718 during a low-side on phase. On-phase detector 716 may detect failures during the high-side on phase based on a differentiator that calculate the derivative of the sensed current (see FIG. 3). For example, on-phase detector 716 may detect failures using a characteristic that during the high-side on phase, the inductor current slope should be positive. If a high-side failure occurs, the current may begin to flow through the short, which may reduce the sensed current, as showed in FIG. 5. The reduction of the sensed current may lead to a negative sensed current slope during the high-side on phase, which the on-phase detector 716 may use to determine that a high-side failure is present.

In FIG. 7, an output of the differentiator (shown as an output of comp) may be output to an AND gate 717. AND gate 717 may include a first input electrically coupled to the output of the operational amplifier (e.g., comp) and a second input coupled to a masking pulse and/or an indication that high-side switching element 734 is to be switched-in. An output of AND gate 717 may output an indication of whether the first failure has occurred at device 700. As shown, the masking pulse may be output by a clock & masking pulse generator of power converter 706. The indication that high-side switching element 134 is to be switched-in may be output by a controller of power converter 706.

During the low-side on phase, off-phase detector 718 may determine whether a failure has occurred based on the detection of cross conduction currents. For example, off-phase detector 718 may detect a failure by combining the information of current in the low-side switching element 736 (which may flow from drain to source) and a voltage at the switching node 735, which may be high (e.g., positive or greater than a threshold) during a high-side failure. For example, off-phase detector 718 may include a set of AND gates configured to receive an indication of whether the current at low-side switching element 736 is less than a current threshold value and an indication of whether the voltage at switch node 735 exceeds a threshold voltage value. In this example, the set of AND gates are configured to output an indication of whether the second failure has occurred at device 700. As discussed further below, off-phase detector 718 may receive the indication of the current at low-side switching element 136 from a negative overcurrent comparator (NOC) 760. In some examples, off-phase detector 718 may receive an indication of the voltage at switch node 735 from switch node sensor circuitry 762.

Example advantages of using on-phase detector 716 and off-phase detector 718 may include faster failure detection than can be achieved with other techniques (e.g., failure detection within one switching cycle). As such, circuit 704 may disconnect the PMIC from battery 702, which may potentially avoid possible collateral effect caused by a high-side failure.

For example, protection circuit 704 may switch OFF the protection switch within one switching cycle using detection mechanisms according to the step-down regulator SW status: ON phase (see FIG. 5) or OFF phase (see FIG. 6) and optionally in the tri-state phase. During the SW ON phase (High-Side ON and Low-Side OFF) and in case of failure, current sensed through high-side switching element 734 (which may be present in a Buck converter to protect from overcurrent) may not detect a short condition. For example, the output of the OC comparator & sense module 751 may not detect a short condition because current flows through a high-side short between drain and source of high-side switching element 734. On-phase detector 716 may use a different working mode of a circuit (e.g., the overcurrent sense in this case) already present in the device. On-phase detector 716 may use a differentiator amplifier (see FIG. 3) to detect the failure.

During the SW OFF phase (High-Side OFF and Low-Side ON) and in case of a failure, a cross conduction may be present because current flows through high-side switching element 734 and low-side switching element 736 with a high voltage at the SW node 735, which may result in the source current of the low-side switching element 735 becoming negative with a voltage at switching node 735 being high. A current comparator sensing current through low-side switching element 736 and/or a voltage comparator on SW node 735 can be used to detect the failure during the off-phase. For a voltage check, a switching sensor 762 present in power converter 706, that is the "SW sensor" used for adaptive dead-time control (low-side switching element 736 may be enabled only when SW has been pulled down by the load in order to optimize the efficiency) can be re-used. For example, switching sensor 762 may be enabled when low-side switching element 736 is ON and protection circuit 704 may use output information from switching sensor 762 directly as a failure detection mechanism. When low-side switching element 736 is ON (without any failure), the output of switching sensor 762 is LOW. However, in the case of a failure of the high-side switching element 734, a voltage at SW node 735 may be forced HIGH and the output of switching sensor 762 may be HIGH.

For the current check, a negative overcurrent comparator (NOC) 762 present in power converter 706 with force continuous-conduction-mode (force-CCM) operation mode. If the current goes below the NOC threshold (that could happen at high input voltage and low load), low-side switching element 736 may be turned from ON to OFF state, putting SW node 735 in a tri-state condition. In accordance with the techniques of the disclosure, off-phase detector 718 may use the output of NOC 762 and an indication of the voltage at switching node 735. For example, off-phase detector 718 may determine that a high-side short has occurred in response to when the current goes below the NOC threshold and when SW sensor voltage 762 is high (See FIG. 6). In contrast, off-phase detector 718 may determine that a high-side short has not occurred (e.g., a common NOC event) in response to when the current goes below the NOC threshold and when SW sensor voltage 762 is low (See FIG. 6).

During the tri-state phase (e.g., when in discontinuous-conduction-mode (DCM)) both high-side switching element 734 and low-side switching element 736 are OFF and so the relative sensing structures may not detect a short. Also, SW node sensor 762 may not be used as a voltage at SW node 735 in the tri-phase may move (e.g., ringing between $V_{batt}$+ $V_{dio}$ and 0−$V_{dio}$). In accordance with the techniques of the disclosure, tri-state detector 720 may apply a fast overvoltage check directly on the output of power converter 706 with a threshold above the maximum value of the regulation range but below the maximum rating of regulator output. In some examples, tri-state detector 720 may use a current comparator to sense a current flowing through protection switch 760 (or through a sense resistor for protection switch 760) with a threshold above the regulator max over-current.

In the example of FIG. 7, a low voltage post-regulator 770 may configured to receive the output voltage from power converter 706 and to generate a post-regulated voltage. The post-regulated voltage may be different than (e.g., less than or greater than) the output voltage.

Figure 8:
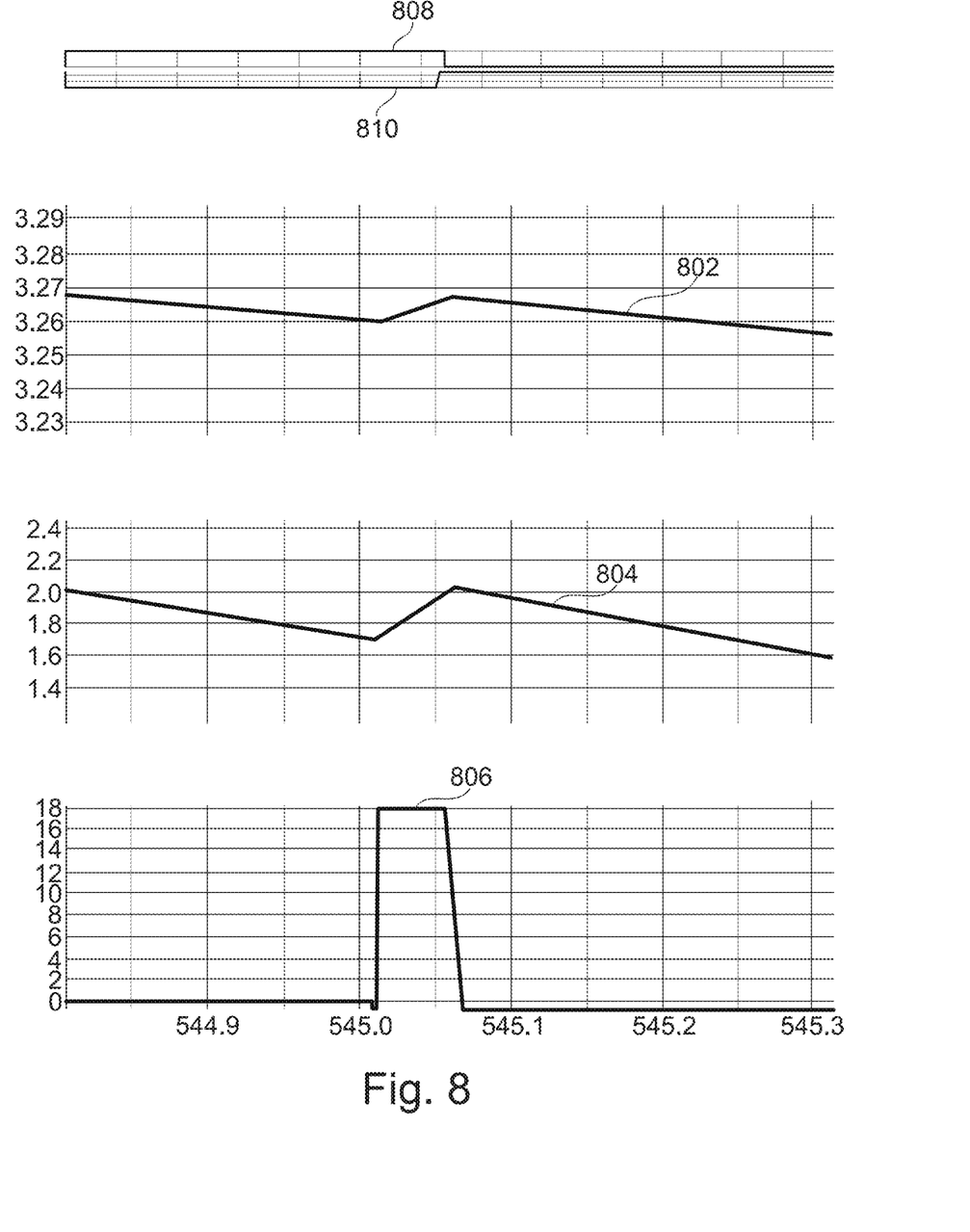
FIG. 8 is a graph illustrating a performance of an on-phase detector during a short, in accordance with one or more techniques of this disclosure.

FIG. 8 is a graph illustrating a performance of an on-phase detector during a short, in accordance with one or more techniques of this disclosure. FIG. 8 is discussed with FIGS. 1-7 for example purposes only. The abscissa axis of FIG. 8 represents time (micro-seconds) and the ordinate axis of FIG. 8 represents an output voltage 802 of power converter 106, an inductor current 804 for power converter 106, a voltage 806 at switch node 135, a short signal 810, and a cutoff on signal 808 during an on-phase. In the example of FIG. 8, protection circuit 104 may generate cutoff on signal 808 to cause protection switch circuitry 114 to electrically disconnect high-side switching element 134 from supply circuit 102 in response to the short circuit indicated by short signal 810. As shown, output voltage 802 remains within a safe operating range.

Figure 9:
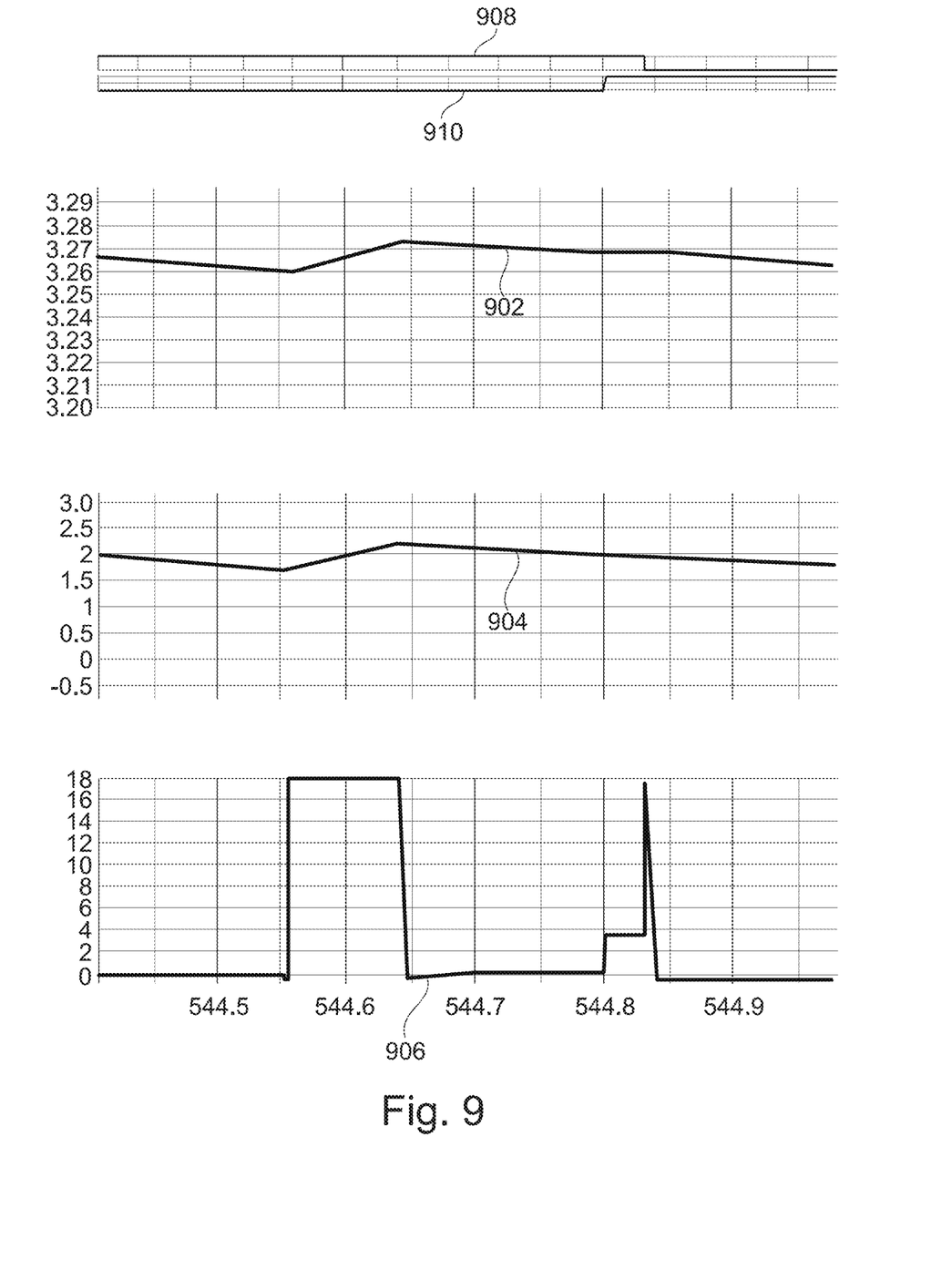
FIG. 9 is a graph illustrating a performance of an off-phase detector during a short, in accordance with one or more techniques of this disclosure.

FIG. 9 is a graph illustrating a performance of an off-phase detector during a short, in accordance with one or more techniques of this disclosure. FIG. 9 is discussed with FIGS. 1-8 for example purposes only. The abscissa axis of FIG. 9 represents time (micro-seconds) and the ordinate axis of FIG. 9 represents an output voltage 902 of power converter 106, an inductor current 904 for power converter 106, a voltage 906 at switch node 135, a short signal 910, and a cutoff on signal 908 during an off-phase. In the example of FIG. 9, protection circuit 104 may generate cutoff on signal 908 to cause protection switch circuitry 114 to electrically disconnect high-side switching element 134 from supply circuit 102 in response to the short circuit indicated by short signal 910. As shown, output voltage 902 remains within a safe operating range.

Figure 10:
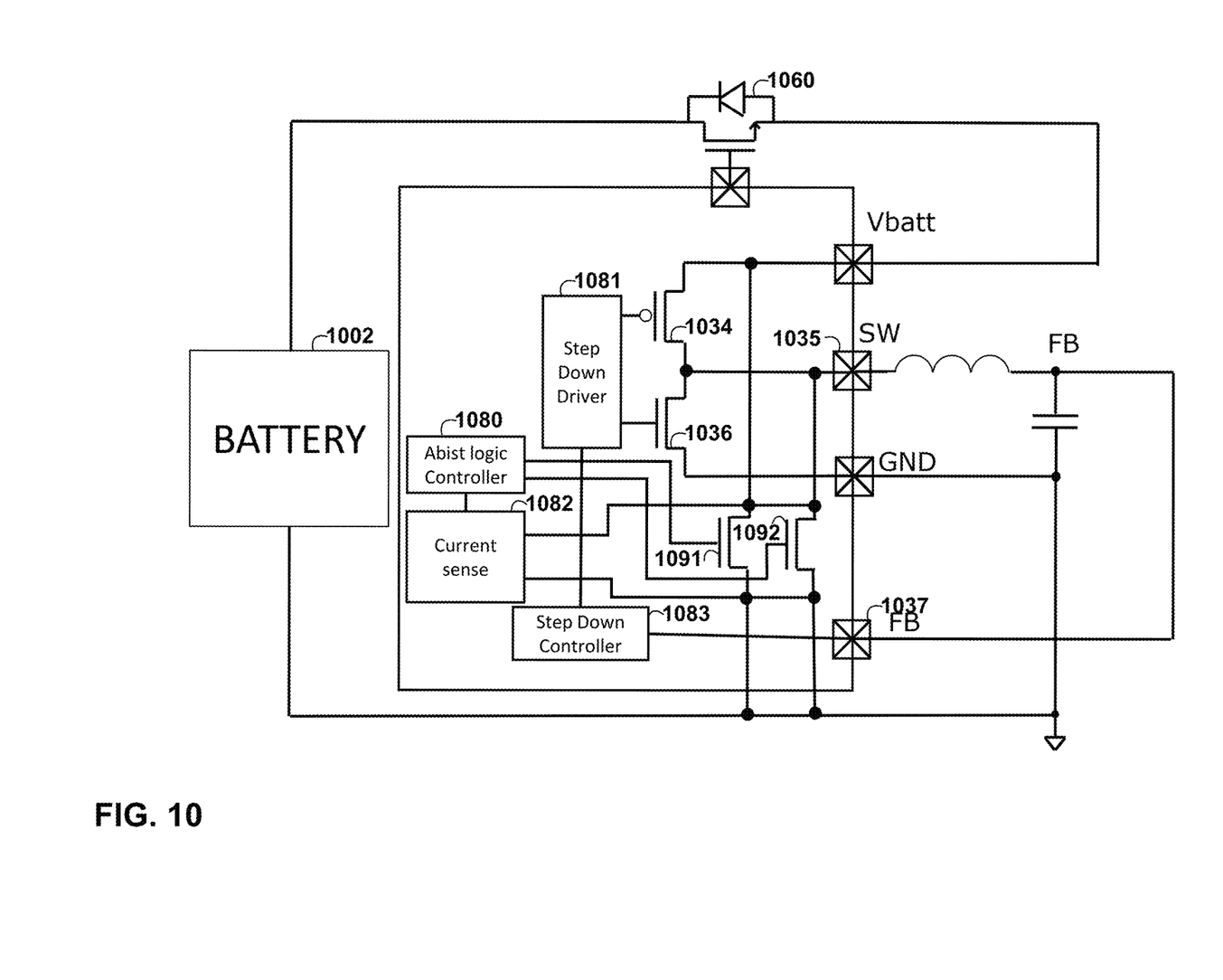
FIG. 10 is a conceptual diagram illustrating an example analog built-in self-test systems, in accordance with one or more techniques of this disclosure.

FIG. 10 is a conceptual diagram illustrating an example analog built-in self-test systems, in accordance with one or more techniques of this disclosure. FIG. 10 illustrates an example analog built in self-test is provided to avoid powering of the device in case of failure. As shown, the system of FIG. 10 may include battery 1002, protection switch 1060, analog built-in self-test (ABIST) 1080, step-down driver 1081, current sense circuitry 1082, switch 1091, and switch 1092, and step-down controller 1083.

Techniques described herein using an on-phase detector and an off-phase detector may provide a fast protection mechanism of a PMIC with one or more Buck pre-regulator in case of high-side failure in order to avoid damage of the device. In an ISO26262 context, the fast protection mechanism may be beneficial to evaluate internal failures. In a step-down regulator with integrated power stage, a critical failure may include a short between a source and a drain of high-side switching element 1034 because this fault may propagate the step-down supply voltage to the output voltage that might overcome a maximum voltage rating, which may cause damage to the device itself.

If the device destruction is violating a safety goal, the ASIL level reachable by the device could be impacted because high-side switching element 1034 may be generally occupying a lot of area and thus weighting a lot in the failures-in-time (FIT) number calculation. An example way to avoid the damage of the device, in case of internal short between the high-side switching element 1034 source and drain, is to make the maximum rating of the feedback (FB) pin 1037 equal to the maximum rating of a voltage of the battery 1002 (Vbatt) and switch (SW) node 1035. As shown, switch node 1035 is arranged between high-side switching element 1034 and low-side switching element 1036. A drawback of increasing the maximum rating of FB pin 1037 is the area increase needed to reach this goal, above all if inside a PMIC there are more than one Buck converter.

Moreover if, for example, output voltage is the supply for a DCDC or linear post regulator inside the same device, the impact may be greater. To avoid the damage of the device in this case, the maximum rating of each of the post regulators is increased, which may lose one of the advantages to have a pre-regulator and potentially make performance worse.

Another example way to avoid the damage of the device, is to make the high-side switching element and the driver redundant. For instance, two switching elements may be used to perform the switching of the high-side switch. Making the high-side switching element and the driver redundant, may avoid the single point failure (DCDC is always in operation). However, to have the same on-resistance ($R_{on}$) performance, an area of potentially four times bigger for the high-side switching element is needed compared to systems that do not make the high-side switching element and driver redundant. As a consequence, driving losses may become worse compared to systems that do not make the high-side switching element and driver redundant, which may be further exacerbated as the switching frequency is increased.

Another example way to avoid damage of the device, is to add a protection loop within the Buck regulation loop in order to protect the Buck converter output voltage from destructive overvoltage. For instance, a protection block may be placed between the inductor of the Buck converter and an output of the Buck converter to help to prevent a propagation of the failure to FB pin 1037. The drawback is in case of more step-down regulators connected to the same supply, the system may use a number of "protection loop" equal to the number of step-down regulators, which may increase a number of components and/or a cost of the device.

In accordance with the techniques of the disclosure, a protection switch 1060 may protect the device from high-side failures. As shown in FIG. 10, protection switch 1060 include an external NMOS switch, with a drain connected to battery 1002 and source to all the step down converters to be protected by high-side failures. During normal operation, the external NMOS of protection switch 1060 may be always on, allowing the current to flow from battery 1002 to all the step-down regulators connected. In the case of a high-side failure, the external NMOS of protection switch 1060 may be opened by bringing a gate voltage of the external NMOS of protection switch 1060 to zero.

Protection switch 1060 may have an on resistance ($R_{on}$) set to be as low to increase the regulator efficiency. Protection switch 1060 may include a current rating sized according to the sum of all the step-down peak current that are connected to protection switch 1060. The voltage ($V_{GATE}$) at a gate of protection switch 1060 may be controlled by a charge pump and the voltage at the gate of protection switch 1060 may be selected to help to ensure that protection switch 1060 operates in a linear region during normal functioning, thus $V_{GATE} > V_{batt} + V_{th} + V_{margin}$, where $V_{batt}$ is a voltage output by battery 1002, $V_{th}$ is a threshold voltage for operating protection switch 1060 in the linear region, and $V_{margin}$ is a voltage margin. In this way, the protection mechanism helps to prevent the voltage at FB pin 1035 from exceeding a maximum rating and/or a maximum rating of everything FB pin 1035 is supplying. If a high-side failure is detected, all the step-down regulators are abruptly disconnected from the battery, then the regulated voltages are not available.

Figure 11:
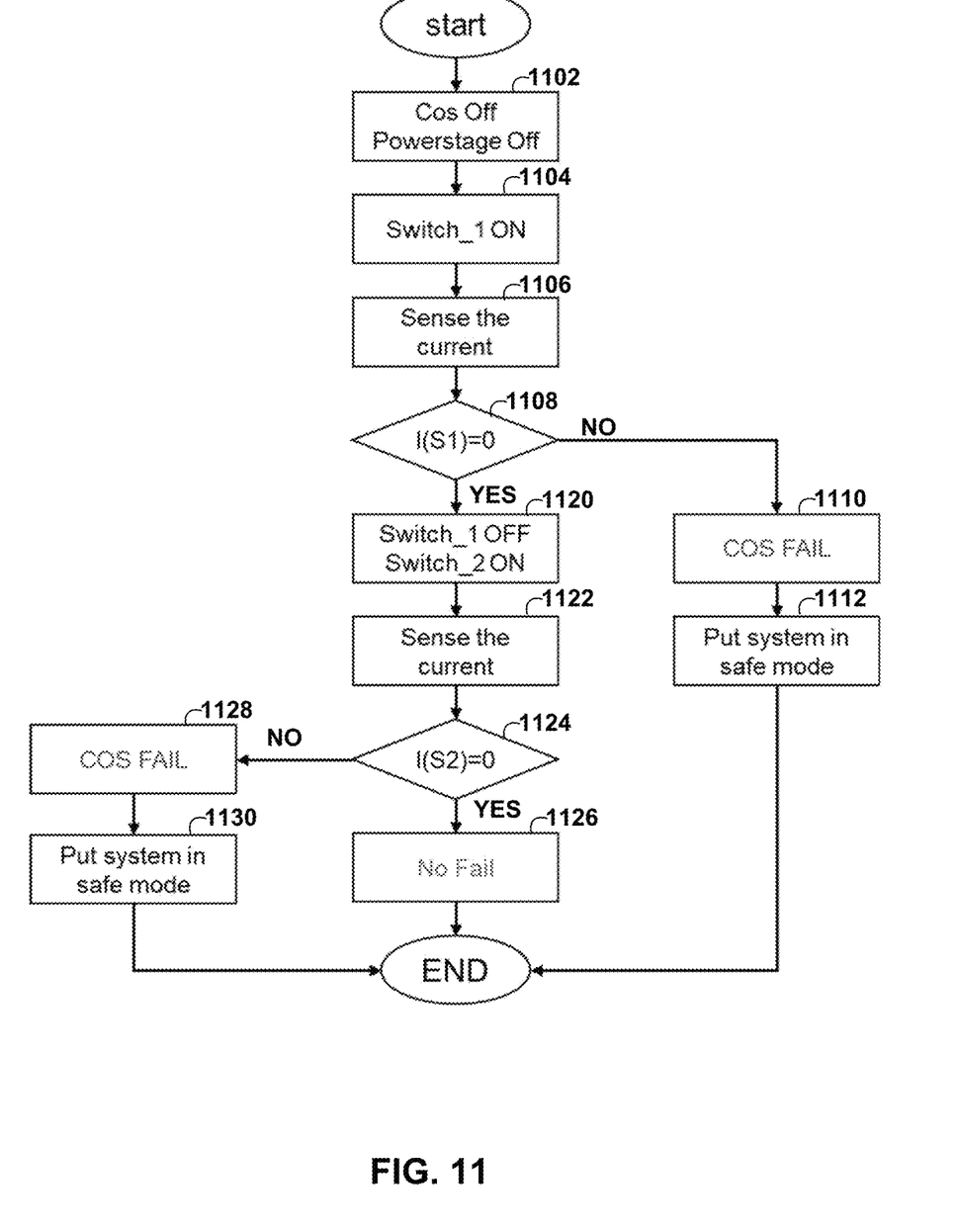
FIG. 11 is a flow chart illustrating an example analog built-in self-test process, in accordance with one or more techniques of this disclosure.

FIG. 11 is a flow chart illustrating an example analog built-in self-test process, in accordance with one or more techniques of this disclosure. FIG. 11 is discuss with FIGS. 1-10 for example purposes only. In an ISO 26262 context, to decrease the latent faults, the example of FIG. 10 includes an analog built-in self-test (ABIST), such as ABIST logic controller 1080, on both the external MOS and on the high-side, to be run at power on.

For a failure mode where the cut-off switch is always closed (ON or shorted). In this example, the Buck converter is switched off and the Cut-Off Switch is switched off (1102). A small switch 1091 may be added from between the Buck input pin and ground (1104). Current sense 1082 senses current at switch 1091 (1106). If no or very low current is sensed at switch 1091, the Cut-Off Switch is working fine ("YES" of block 1108). If a current is sensed through this path the Cut-Off Switch is always closed ("NO" of block 1108) and the failure is detected ("COS FAIL") (1110) and the system is put in a safe mode (1112). This auxiliary switch may have high on-resistance ($R_{on}$) to avoid high current during a failure.

For a failure mode where high-side switching element 1034 is always closed, the Buck converter is switched off and the cutoff is switched off (1120). In this example, a small switch may be used to bring an internal bias voltage to the high-side drain, then a switch 1092 may be added in parallel with low-side switching element 1036. In this example, when the small switch used to bring the internal bias voltage to the high-side drain and switch 1092 are both closed, current sense 1082 measures current at switch 1092 (block 1122). If there is no or very low current ("YES" of block 1124), the high-side switching element is working fine (e.g., there is no failure) (1126). If a current is sensed through this path ("NO" of block 1124), the failure is detected (1128) and the system is put in a safe mode (1130).

Figure 12:
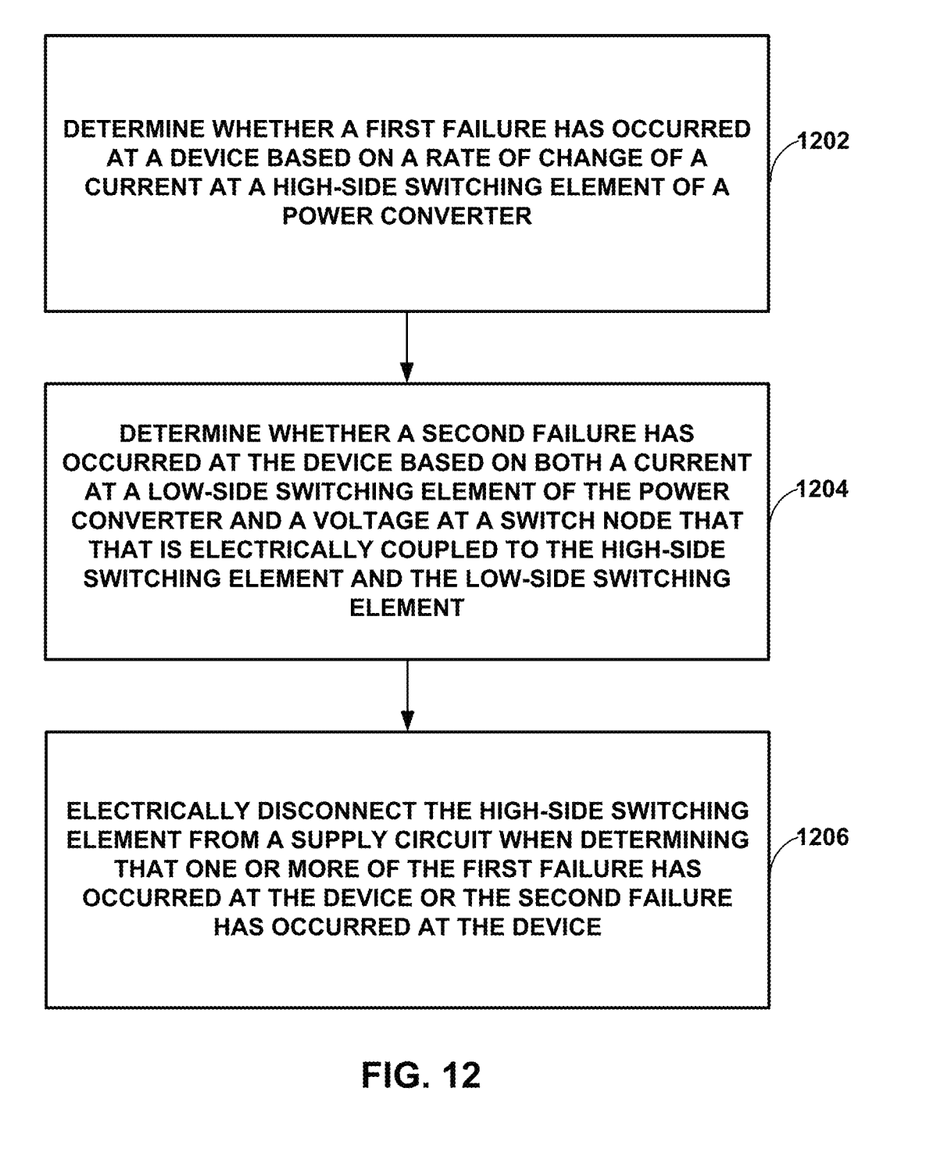
FIG. 12 is a flow diagram illustrating a process for detecting failure of a device, in accordance with this disclosure.

FIG. 12 is a flow diagram illustrating a process for detecting failure of a device, in accordance with this disclosure. FIGS. 1-11 are discussed with respect to FIG. 12 for example purposes only. On-phase detector 116 may determine whether a first failure has occurred at device 100 based on a rate of change of a current at high-side switching element 134 of power converter 106 (1202). For example, on-phase detector 116 may determine that the first failure has occurred at device 100 based on the rate of change of the current sensed at high-side switching element 134 being less than a rate of change threshold value. The rate of change threshold value may be predefined. On-phase detector 116 is configured to receive an indication of the current at high-side switching element 134 from an overcurrent comparator and sense circuitry for power converter 106 (see FIG. 7). Power converter 106 may include, for example, a Buck converter.

On-phase detector 116 may determine whether the first failure has occurred at device 100 based on the rate of change of the current at high-side switching element 134 and based further on a masking pulse indicating that a measurement of the current at high-side switching element 134 is accurate. The masking pulse may be output by a clock & masking pulse generator of a power converter (see FIG. 7). On-phase detector 116 may determine whether the first failure has occurred at device 100 based on the rate of change of the current at high-side switching element 134 and based further on an indication that high-side switching element 134 is to be switched-in. The indication that high-side switching element 134 is to be switched-in may be output by a controller of the power converter (see FIG. 7).

On-phase detector 116 may include a differentiator circuit, for example, as shown in FIG. 3. For example, on-phase detector 116 may include operational amplifier 354, which includes a first input (−) coupled to the second node of capacitor 350 and the first node of resistive element 352, a second input (+) coupled to a reference voltage (e.g., ground), and an output (e.g., −$V_{out}$) electrically coupled to the second node of resistive element 352. On-phase detector 116 may further include AND gate 717 including a first input electrically coupled to the output of the operational amplifier and a second input coupled to a masking pulse or an indication that high-side switching element 734 is to be switched-in. An output of AND gate 717 may output an indication of whether the first failure has occurred at device 700.

Off-phase detector 118 may determine whether a second failure has occurred at device 100 based on both a current at low-side switching element 136 of power converter 106 and a voltage at switch node 135 that that is electrically coupled to high-side switching element 134 and low-side switching element 136 (1204). For example, off-phase detector 118 may determine that the second failure has occurred at device 100 based on receiving the indication that current at low-side switching element 136 is less than a threshold value (e.g., is less than zero or less than a non-zero threshold value) and an indication that voltage at the switch node 135 exceeds a voltage threshold value. Off-phase detector 118 may receive the indication of the current at low-side switching element 136 from a negative overcurrent comparator (NOC) for power converter 106 (e.g., see FIG. 7). In some examples, off-phase detector 118 may receive an indication of the voltage at switch node 135 from switch node sensor circuitry for power converter 106 (e.g., see FIG. 7). For example, off-phase detector 118 may include a set of AND gates configured to receive an indication of whether the current at low-side switching element 136 is less than a current threshold value and an indication of whether the voltage at switch node 135 exceeds a threshold voltage value. In this example, the set of AND gates may be configured to output an indication of whether the second failure has occurred at device 100. Off-phase detector 118 may, in some examples, receive an indication of whether the low-side switching element is to be switched-in (e.g., see FIG. 7). In this example, the set of AND gates may be configured to output an indication that the second failure has occurred at device 100 when current at low-side switching element 136 is less than a threshold value (e.g., negative), voltage at the switch node 135 exceeds a voltage threshold value, and when the low-side switching element is to be switched-in.

Protection circuit 104 may optionally include tri-state detector 120. Tri-state detector 120 may be configured to determine whether a third failure has occurred based on both a current at a protection switch of protection switch circuitry 114 and an output voltage output by power converter 106. For example, tri-state detector 120 may determine that the third failure has occurred at device 100 when the current at the protection switch is greater than an input current threshold value and to determine that the third failure has occurred at the device when the output voltage exceeds an input voltage threshold value. Tri-state detector 120 may receive an indication of the current at the high-side switching element from protection switch circuitry 114 (see FIG. 7). Tri-state detector 720 may receive an indication of the output voltage from power converter 106 (see FIG. 7).

Protection switch circuitry 114 may electrically disconnect high-side switching element 134 from supply circuit 102 in response determining that the first failure has occurred at device 100 or in response to determining that the second failure has occurred at device 100 (1206). For example, protection switch circuitry 114 may include a switch (e.g., protection switch 760 of FIG. 7) configured to disconnect supply circuit 102 from power converter 106 when one or more of on-phase detector 716 determines that the first failure has occurred at device 100 or off-phase detector 718 determines that the second failure has occurred at device 100. In some examples, protection switch circuitry 114 may disconnect supply circuit 102 from power converter 106 when one or more of on-phase detector 116 determines that the first failure has occurred at device 100, when off-phase detector 118 determines that the second failure has occurred at device 100, and further when tri-state detector 120 determines that the third failure has occurred at device 100.

The following clauses may illustrate one or more aspects of the disclosure.

Clause 1. A circuit for detecting failure of a device, the circuit comprising: an on-phase detector configured to determine whether a first failure has occurred at the device based on a rate of change of a current at a high-side switching element of a power converter; an off-phase detector configured to determine whether a second failure has occurred at the device based on both a current at a low-side switching element of the power converter and a voltage at a switch node that is electrically coupled to the high-side switching element and the low-side switch; and protection switch circuitry configured to electrically disconnect the high-side switching element from a supply circuit in response to the on-phase detector determining that the first failure has occurred at the device or in response to the off-phase detector determining that the second failure has occurred at the device.

Clause 2. The circuit of clause 1, wherein the on-phase detector is configured to determine that the first failure has occurred at the device based on the rate of change of the current sensed at the high-side switching element being less than a rate of change threshold value.

Clause 3. The circuit of any of clauses 1-2, wherein the on-phase detector is configured to determine whether the first failure has occurred at the device based on the rate of change of the current at the high-side switching element and based further on a masking pulse or an indication that the high-side switching element is to be switched-in.

Clause 4. The circuit of any of clauses 1-3, wherein the on-phase detector comprises a differentiator circuit.

Clause 5. The circuit of any of clauses 1-4, wherein the on-phase detector comprises: a capacitor comprising a first node configured to receive an indication of the current at the high-side switching element and a second node; a resistive element comprising a first node coupled to the second node of the capacitor and a second node; and an operational amplifier comprising a first input coupled to the second node of the capacitor and the first node of the resistive element, a second input coupled to a reference voltage, and an output electrically coupled to the second node of the resistive element.

Clause 6. The circuit of clause 5, wherein the on-phase detector further comprises an AND gate comprising a first input electrically coupled to the output of the operational amplifier and a second input coupled to a masking pulse or an indication that the high-side switching element is to be switched-in and wherein an output of the AND gate outputs an indication of whether the first failure has occurred at the device.

Clause 7. The circuit of any of clauses 1-6, wherein the on-phase detector is configured to receive an indication of the current at the high-side switching element from overcurrent comparator and sense circuitry for the power converter.

Clause 8. The circuit of any of clauses 1-7, wherein the off-phase detector is configured to receive an indication that the current at the low-side switching element is less than a current threshold value; wherein the off-phase detector is configured to receive an indication that the voltage at the switch node exceeds a voltage threshold value; and wherein the off-phase detector is configured to determine that the second failure has occurred at the device based on receiving the indication that the current at the low-side switching element is less than the current threshold value and the indication that the voltage at the switch node exceeds a voltage threshold value.

Clause 9. The circuit of any of clauses 1-8, wherein the off-phase detector is configured to receive an indication of the current at the low-side switching element from a negative overcurrent comparator for the power converter; and wherein the off-phase detector is configured to receive an indication of the voltage at the switch node from switch node sensor circuitry for the power converter.

Clause 10. The circuit of any of clauses 1-9, wherein the off-phase detector comprises a set of AND gates configured to receive an indication of whether the current at the low-side switching element of the power converter is less than a current threshold value and an indication of whether the voltage at the switch node exceeds a threshold voltage value and wherein the set of AND gates are configured to output an indication of whether the second failure has occurred at the device.

Clause 11. The circuit of any of clauses 1-10, wherein the set of AND gates are further configured to receive an indication of whether the low-side switching element is to be switched-in.

Clause 12. The circuit of any of clauses 1-11, comprising: a tri-state detector configured to determine whether a third failure has occurred based on both a current at a protection switch of the protection switch circuitry and an output voltage output by the power converter; and wherein the protection switch circuitry is further configured to electrically disconnect the high-side switching element from the supply circuit in response to the tri-state detector determining that the third failure has occurred at the device.

Clause 13. The circuit of clause 12, wherein the tri-state detector is configured to determine that the third failure has occurred at the device when the current at the protection switch is greater than an input current threshold value and to determine that the third failure has occurred at the device when the output voltage exceeds an input voltage threshold value.

Clause 14. The circuit of any of clauses 12-13, wherein the tri-state detector is configured to receive an indication of the current at the high-side switching element from the protection switch circuitry; and wherein the tri-state detector is configured to receive an indication of the output voltage from the power converter.

Clause 15. The circuit of any of clauses 1-14, wherein the protection switch circuitry comprises a switch configured to disconnect the supply circuit from the power converter when one or more of the on-phase detector determines that the first failure has occurred at the device or the off-phase detector determines that the second failure has occurred at the device.

Clause 16. The circuit of any of clauses 1-15, wherein the power converter comprises a Buck converter.

Clause 17. A method for detecting failure of a device, the method comprising: determining whether a first failure has occurred at the device based on a rate of change of a current at a high-side switching element of a power converter; determining whether a second failure has occurred at the device based on both a current at a low-side switching element of the power converter and a voltage at a switch node that is electrically coupled to the high-side switching element and the low-side switch; and electrically disconnecting the high-side switching element from a supply circuit in response determining that the first failure has occurred at the device or in response to determining that the second failure has occurred at the device.

Clause 18. A system comprising: a power converter configured to output an output voltage, the power converter comprising a high-side switching element and a low-side switching element, wherein a switch node is electrically coupled to the high-side switching element and the low-side switch; and a circuit for detecting failure of a device, the circuit comprising: an on-phase detector configured to determine whether a first failure has occurred at a device based on a rate of change of a current at the high-side switching element; an off-phase detector configured to determine whether a second failure has occurred at the device based on both a current at the low-side switching element and a voltage at the switch node; and protection switch circuitry configured to electrically disconnect the high-side switching element from a supply circuit in response to the on-phase detector determining that the first failure has occurred at the device or in response to the off-phase detector determining that the second failure has occurred at the device.

Clause 19. The system of clause 18, further comprising the supply circuit.

Clause 20. The system of any of clauses 18-19, further comprising a low voltage post-regulator configured to receive the output voltage and to generate a post-regulated voltage that is different than the output voltage.

Various aspects have been described in this disclosure. These and other aspects are within the scope of the following claims.

The invention claimed is:

1. A circuit for detecting failure of a device, the circuit comprising:
   an on-phase detector configured to determine whether a first failure has occurred at the device based on a rate of change of a current at a high-side switching element of a power converter;
   an off-phase detector configured to determine whether a second failure has occurred at the device based on both a current at a low-side switching element of the power converter and a voltage at a switch node that is electrically coupled to the high-side switching element and the low-side switch; and
   protection switch circuitry configured to electrically disconnect the high-side switching element from a supply circuit in response to the on-phase detector determining that the first failure has occurred at the device or in response to the off-phase detector determining that the second failure has occurred at the device.

2. The circuit of claim 1, wherein the on-phase detector is configured to determine that the first failure has occurred at the device based on the rate of change of the current sensed at the high-side switching element being less than a rate of change threshold value.

3. The circuit of claim 1, wherein the on-phase detector is configured to determine whether the first failure has occurred at the device based on the rate of change of the current at the high-side switching element and based further on a masking pulse or an indication that the high-side switching element is to be switched-in.

4. The circuit of claim 1, wherein the on-phase detector comprises a differentiator circuit.

5. The circuit of claim 1, wherein the on-phase detector comprises:
   a capacitor comprising a first node configured to receive an indication of the current at the high-side switching element and a second node;
   a resistive element comprising a first node coupled to the second node of the capacitor and a second node; and
   an operational amplifier comprising a first input coupled to the second node of the capacitor and the first node of the resistive element, a second input coupled to a reference voltage, and an output electrically coupled to the second node of the resistive element.

6. The circuit of claim 5, wherein the on-phase detector further comprises an AND gate comprising a first input electrically coupled to the output of the operational amplifier and a second input coupled to a masking pulse or an indication that the high-side switching element is to be switched-in and wherein an output of the AND gate outputs an indication of whether the first failure has occurred at the device.

7. The circuit of claim 1, wherein the on-phase detector is configured to receive an indication of the current at the high-side switching element from overcurrent comparator and sense circuitry for the power converter.

8. The circuit of claim 1,
wherein the off-phase detector is configured to receive an indication that the current at the low-side switching element is less than a current threshold value;
wherein the off-phase detector is configured to receive an indication that the voltage at the switch node exceeds a voltage threshold value; and
wherein the off-phase detector is configured to determine that the second failure has occurred at the device based on receiving the indication that the current at the low-side switching element is less than the current threshold value and the indication that the voltage at the switch node exceeds a voltage threshold value.

9. The circuit of claim 1,
wherein the off-phase detector is configured to receive an indication of the current at the low-side switching element from a negative overcurrent comparator for the power converter; and
wherein the off-phase detector is configured to receive an indication of the voltage at the switch node from switch node sensor circuitry for the power converter.

10. The circuit of claim 1, wherein the off-phase detector comprises a set of AND gates configured to receive an indication of whether the current at the low-side switching element of the power converter is less than a current threshold value and an indication of whether the voltage at the switch node exceeds a threshold voltage value and wherein the set of AND gates are configured to output an indication of whether the second failure has occurred at the device.

11. The circuit of claim 10, wherein the set of AND gates are further configured to receive an indication of whether the low-side switching element is to be switched-in.

12. The circuit of claim 1, comprising:
a tri-state detector configured to determine whether a third failure has occurred based on both a current at a protection switch of the protection switch circuitry and an output voltage output by the power converter; and
wherein the protection switch circuitry is further configured to electrically disconnect the high-side switching element from the supply circuit in response to the tri-state detector determining that the third failure has occurred at the device.

13. The circuit of claim 12, wherein the tri-state detector is configured to determine that the third failure has occurred at the device when the current at the protection switch is greater than an input current threshold value and to determine that the third failure has occurred at the device when the output voltage exceeds an input voltage threshold value.

14. The circuit of claim 12,
wherein the tri-state detector is configured to receive an indication of the current at the high-side switching element from the protection switch circuitry; and
wherein the tri-state detector is configured to receive an indication of the output voltage from the power converter.

15. The circuit of claim 1, wherein the protection switch circuitry comprises a switch configured to disconnect the supply circuit from the power converter when one or more of the on-phase detector determines that the first failure has occurred at the device or the off-phase detector determines that the second failure has occurred at the device.

16. The circuit of claim 1, wherein the power converter comprises a Buck converter.

17. A method for detecting failure of a device, the method comprising:
determining whether a first failure has occurred at the device based on a rate of change of a current at a high-side switching element of a power converter;
determining whether a second failure has occurred at the device based on both a current at a low-side switching element of the power converter and a voltage at a switch node that is electrically coupled to the high-side switching element and the low-side switch; and
electrically disconnecting the high-side switching element from a supply circuit in response determining that the first failure has occurred at the device or in response to determining that the second failure has occurred at the device.

18. A system comprising:
a power converter configured to output an output voltage, the power converter comprising a high-side switching element and a low-side switching element, wherein a switch node is electrically coupled to the high-side switching element and the low-side switch; and
a circuit for detecting failure of a device, the circuit comprising:
an on-phase detector configured to determine whether a first failure has occurred at a device based on a rate of change of a current at the high-side switching element;
an off-phase detector configured to determine whether a second failure has occurred at the device based on both a current at the low-side switching element and a voltage at the switch node; and
protection switch circuitry configured to electrically disconnect the high-side switching element from a supply circuit in response to the on-phase detector determining that the first failure has occurred at the device or in response to the off-phase detector determining that the second failure has occurred at the device.

19. The system of claim 18, further comprising the supply circuit.

20. The system of claim 18, further comprising a low voltage post-regulator configured to receive the output voltage and to generate a post-regulated voltage that is different than the output voltage.

* * * * *